(12) United States Patent
Iketani

(10) Patent No.: US 6,528,330 B2
(45) Date of Patent: Mar. 4, 2003

(54) SEMICONDUCTOR DEVICE MANUFACTURING METHOD

(75) Inventor: Koji Iketani, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/911,972

(22) Filed: Jul. 24, 2001

(65) Prior Publication Data

US 2002/0019066 A1 Feb. 14, 2002

(30) Foreign Application Priority Data

Aug. 3, 2000 (JP) .................................. 2000-236022

(51) Int. Cl.[7] .................................................. G01R 31/26
(52) U.S. Cl. ............................................................ 438/14
(58) Field of Search .................. 438/14, 343; 156/264; 257/787

(56) References Cited

U.S. PATENT DOCUMENTS 5,814,894 A * 9/1998 Igarashi ....................... 257/787
6,113,728 A * 9/2000 Tsukagoshi ................. 156/267

* cited by examiner

*Primary Examiner*—Richard Booth
*Assistant Examiner*—Andre C Stevenson
(74) *Attorney, Agent, or Firm*—Fish & Richardson P.C.

(57) ABSTRACT

According to the invention, during the processing for the measurement and the determination of the characteristic of a semiconductor device, data for the semiconductor device are stored in the memory of a tester. Then, the data for the semiconductor devices are individually stored. Therefore, based on the acquired data, the semiconductor devices are taped, along one taping line, in accordance with their characteristics.

18 Claims, 16 Drawing Sheets

OPERATIONAL DIRECTION

OPERATIONAL DIRECTION

FIG.11

| BAR CODE | SUBSTRATE | POSITION NO. | CHARACTERISTICS (hfe) |
|---|---|---|---|
| 1 | 1 | 1 | 2 |
| 1 | 1 | 2 | 4 |
| 1 | 1 | 3 | 2 |
| | | | |
| 1 | 6 | 100 | 3 |
| 2 | 1 | 1 | 4 |
| | | | |
| 50 | 4 | 25 | 5 |
| | | | |
| 75 | 6 | 98 | 3 |
| 75 | 6 | 99 | 3 |
| 75 | 6 | 100 | 4 |

SEMICONDUCTOR DEVICE MANUFACTURING METHOD

BACKGROUND OF THE INVENTION

The present invention relates to a method for manufacturing a semiconductor device, and relates in particular to a method for manufacturing a semiconductor device whereby a smaller mounting area can be provided by reducing the external size of a package without using lead forming, and a considerable reduction in manufacturing costs can be realized.

In a process for the manufacture of semiconductor devices, multiple semiconductor chips, produced from a single wafer by dicing, are securely mounted in a lead frame, after which transfer molding, using a die and resin injection, is used to seal them. The thus sealed semiconductor chips are then separated to provide multiple individual semiconductor devices. For this process, either a strip-shaped or a hoop-shaped lead frame is employed, but regardless of which type of lead frame is used, only a single sealing procedure is required to simultaneously seal a plurality of semiconductor devices.

FIG. 15 is a diagram showing the process for checking semiconductor chips formed on a wafer. During this process, the quality of each semiconductor chip 1 formed on a wafer 15 is determined. First, the position of the wafer is recognized, and a needle 14 of a probe is fed a distance equivalent to the chip size and is brought into contact with the electrode pad of a semiconductor chip 1. In this state, an input signal wave, which is programmed in advance, is received from an electrode pad, and the output terminal emits a constant signal wave. A tester reads this signal and determines the quality of the semiconductor chip 1. And when the semiconductor chip 1 is determined to be defective, a mark is provided for it, so that when a recognition camera identifies this mark during the process performed to bond the semiconductor chip 1 to the lead frame, the defective semiconductor chip 1 can be removed.

FIG. 16 is a diagram showing a transfer molding process. During this process, the semiconductor chip 1 fixed to a die pad of a lead frame 2 by die bonding or wire bonding is mounted inside a cavity 4, formed of an upper and a lower die 3A and 3B, and an epoxy resin is injected into the cavity 4 to seal the semiconductor chip 1. Once the process has been completed, the lead frame 2 is cut to complete the fabrication of a separate semiconductor device (e.g., Japanese Patent Publication No. H05-129473).

For this process, as is shown in FIG. 17, multiple cavities 4a to 4f, a resin source 5 for injecting a resin, a runner 6, and gates 7 for injecting the resin into the cavities 4a to 4f via the runner 6, are formed in the surface of the die 3B. For example, if ten semiconductor chips 1 are mounted on a single lead frame, ten cavities 4, ten gates 7 and one runner 6 are formed for one lead frame. And the cavities 4 equivalent to, for example, twenty lead frames are formed in the inner surfaces of the die 3.

FIG. 18 is a diagram showing a semiconductor device obtained by transfer molding. The semi conductor chip 1 whereon elements, such as transistors, are formed is securely attached to an island 8 of the lead frame by a brazing material 9, such as solder; the electrode pad of the semiconductor chip 1 is connected to a lead terminal 10 by a wire 11; the periphery of the semiconductor chip 1 is covered with a resin 12 that conforms to the shapes of the cavities 4; and the distal end of the lead terminal 10 is extended outside the resin 12.

Following this, according to the above manufacturing method, the semiconductor chips 1 formed on the wafer are separated into semiconductor devices, and the electrical characteristics (hfe ranks) of these semiconductor devices are measured and determined by a tester. At this time, a check is conducted in accordance with the items that could not be correctly measured during the wafer checking process in the wafer state as is explained while referring to FIG. 15, and/or with the stricter measurement of items referring to the product standards. During the process for measuring and determining the electrical characteristic of a semiconductor device, all the semiconductor devices are aligned in a predetermined direction, and are checked, one by one. Following this process, the semiconductor devices that are determined to be excellent are taped and shipped.

According to the conventional method for manufacturing semiconductor devices using transfer molding, since following the transfer molding the semiconductor chips are cut off and separated into individual semiconductor devices, the electrical characteristics (hfe ranks) are measured for those semiconductor devices that are aligned in a predetermined direction. Thereafter, the semiconductor devices are sorted and taped in accordance with the measured characteristics, so that extra time and processing are required.

Further, when semiconductor devices, the electrical properties of which are determined during processing performed to measure and determine their characteristics, are taped without being sorted in accordance with the hfe ranks, a plurality of taping lines must be prepared. Therefore, since a taping device can not be structured simply, extra working space is required and a limit is imposed on the determinations that can be performed to assign excellent semiconductor devices to multiple ranks.

SUMMARY OF THE INVENTION

To achieve the shortcomings, according to the invention, a method for manufacturing a semiconductor device comprises the steps of:

bonding one semiconductor chip to each of multiple mounting portions of a substrate;

covering the semiconductor chips bonded to the mounting portions with a common resin layer;

bringing the substrate into contact with the resin layer and gluing the substrate to a adhesive sheet;

performing dicing and measurement for the semiconductor chips that are glued to the adhesive sheet. Thus, the semiconductor chips that are integrally supported by the adhesive sheet can be measured, without the having to be separated into individual semiconductor devices.

Further, according to the invention, a method for manufacturing a semiconductor device comprises the steps of:

bonding a semiconductor chip to each of multiple mounting portions of a substrate;

covering the semiconductor chips bonded to the mounting portions with a common resin layer;

bringing the substrate into contact with the resin layer and gluing the substrate to an adhesive sheet;

dicing and measuring the semiconductor chips while the substrate is glued to the adhesive sheet; and storing directly in a carrier tape semiconductor devices glued to the adhesive sheet. Thus, the semiconductor chips can be processed while integrally supported by the adhesive sheet, and need not be separated into individual semiconductor devices until they are stored in a carrier tape.

Furthermore, not only whether the electrical property of each semiconductor device is excellent or inferior, but also the rank to which an excellent semiconductor device belongs can be determined. Additionally, for all the semiconductor devices formed on a substrate, the position and the level of the electrical characteristic are stored as data, and semiconductor devices having the required electrical taping characteristics are selectively collected and taped.

BRIEF DESCRIPTION OF THE DRAWINGS

FIG. 11 is a table for explaining the manufacturing method of the invention;

DETAILED DESCRIPTION OF THE PREFERRED EMBODIMENT

The preferred embodiment of the invention will now be described in detail.

Figure 1:
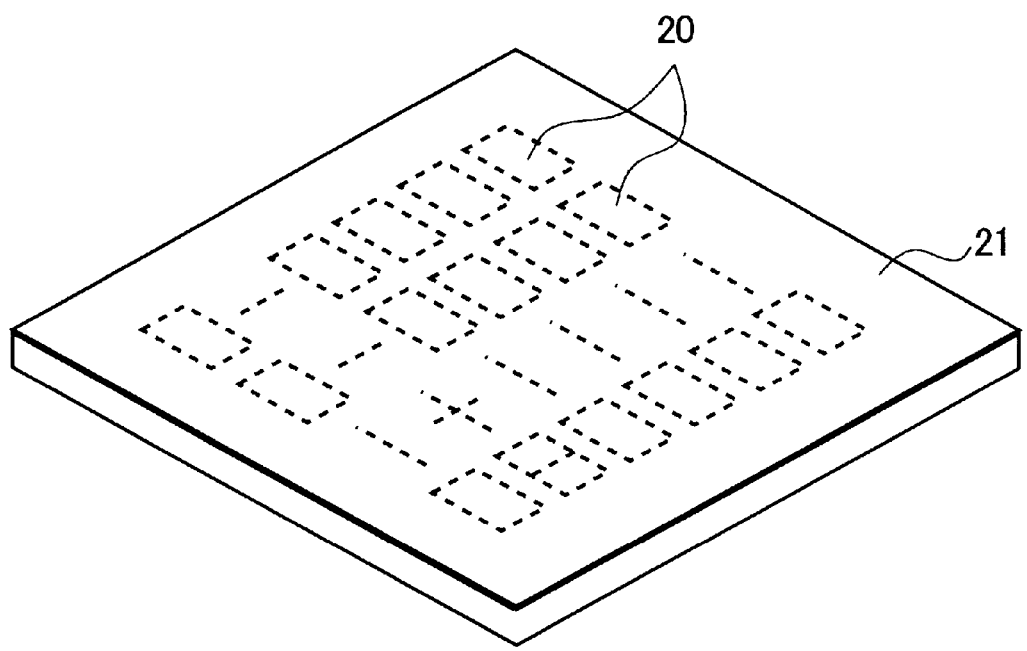
FIG. 1 is a perspective view for explaining a manufacturing method of the invention.
Figure 2A:
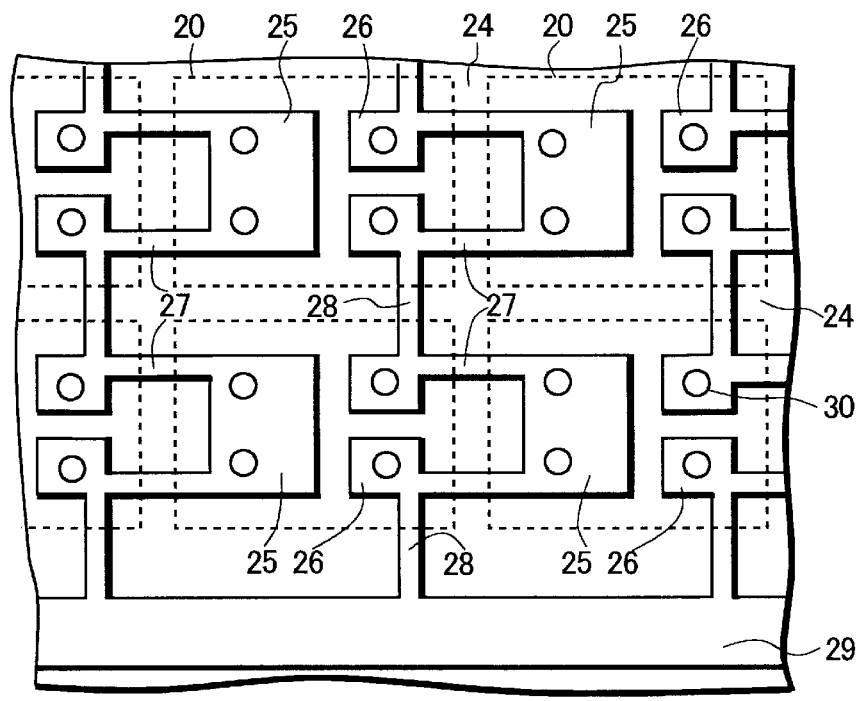
FIG. 2A is a plan view for explaining the manufacturing method of the invention and FIG. 2B is a cross-sectional view for explaining the manufacturing method of the invention.
Figure 2B:
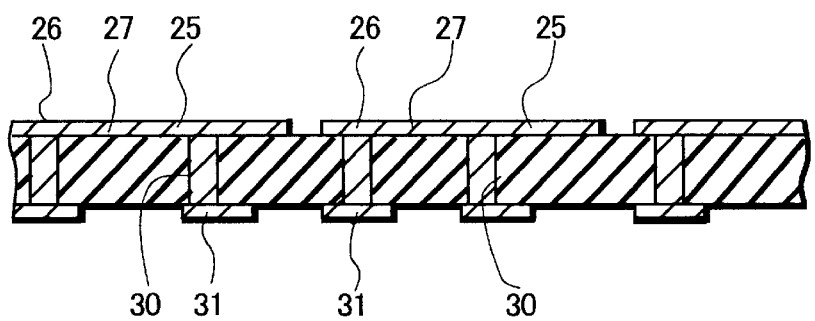
Figure 3:
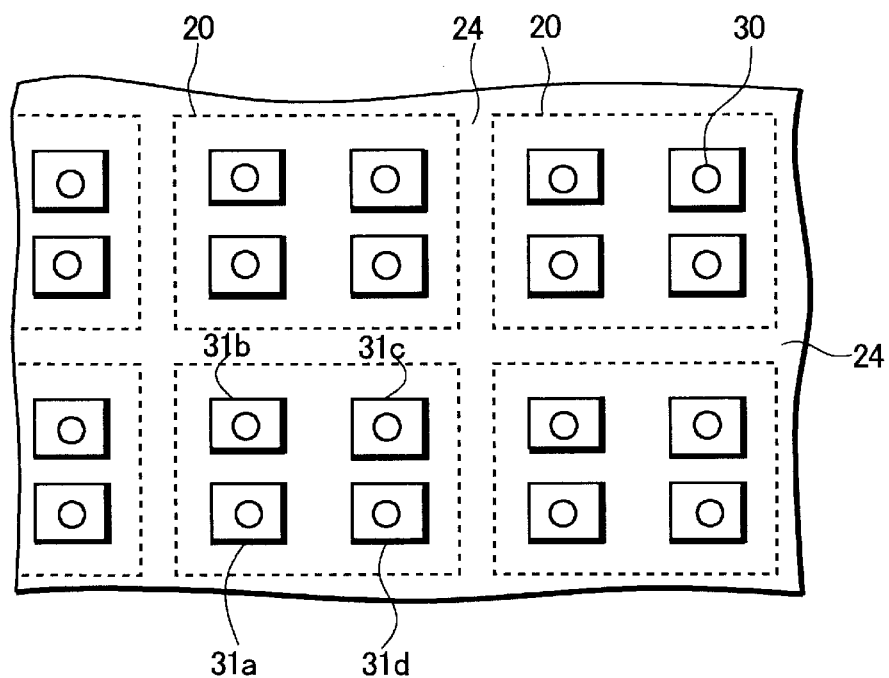
FIG. 3 is a plan view for explaining the manufacturing method of the invention.

A first step for this invention is the preparation of a substrate having multiple mounting portions, as is shown in FIGS. 1 to 3.

First, as is shown in FIG. 1, a large substrate 21 is prepared whereon positions are laid out for multiple mounting portions 20 for corresponding semiconductor devices, so as to provide, for example, a 100-mounting portion 20 arrangement of 10 rows and 10 columns. The substrate 21 is a single or a multilayered glass epoxy or ceramic substrate having a total 200 to 350 [$\mu$m] thickness that will provide adequate mechanical strength during the manufacturing process.

On the obverse surface of each mounting portion 20 on the substrate 21, a metal paste, such as tungsten, is printed on the obverse surface of each mounting portion 20 and a conductive pattern is formed by means of electrolytic-plating with gold. In addition, as an external connection electrode, an electrode pattern is formed on the reverse surface of the substrate 21.

FIG. 2A is a plan view of a conductive pattern formed on the surface of the substrate 21, and FIG. 2B is a cross-sectional view of the substrate 21.

The mounting portions 20 enclosed with broken lines are shaped like rectangles having, for example, long sides of 1.0 mm and short sides of 0.8 mm, and are arranged vertically and horizontally at intervals of 20 to 25 [$\mu$m]. These intervals are used as dicing lines 24 for the following step. As the conductive patterns, island portions 25 and lead portions 26 are formed in each mounting portion 20, and have the same shape in all mounting portions 20. The island portions 25 are where the semiconductor chips are mounted, and the lead portions 26 are the portions that are connected by wires to the electrode pads on the semiconductor chips. Two first connecting portions 27 are extended from each island portion 25 to the lead portions 26 of adjacent mounting portion 20 with a continued pattern, and passing over dicing lines 24 on the way. The line width of the first connecting portions 27 is narrower than the island portion 25, e.g., 0.1 [mm]. In addition, second connecting portions 28, which also pass over dicing lines 24 but in a direction that is perpendicular to that of the first connecting portions 27, are extended from lead portions 26 to the lead portions 26 of adjacent mounting portions 20 or to a common connecting portion 29 that encloses the entire group of mounting portions 20. Since the first and the second connecting portions 27 and 28 are extended as they are, the island portions 25 and the lead portions 26 of all the mounting portions 20 are connected electrically. This arrangement is used because of the common electrodes that are prepared to perform electrolytic plating with gold or the like.

In FIG. 2B, a through hole 30 is formed in each mounting portion 20 on the insulating substrate 21 and is filled with a conductive material, such as tungsten. And for each through hole 30, a corresponding external electrode 31 is formed on the reverse surface.

FIG. 3 is a plan view of the pattern of external electrodes 31a to 31d, viewed from the reverse surface of the substrate 21. The external electrodes 31a, 31b, 31c and 31d are provided 0.05 to 0.1 [mm] away from the ends of the mounting portions 20. Although an individual pattern is provided for the external electrodes 31, they are all connected to the common connecting portion 29 via the through holes 30. Thus, a gold-plated layer can be formed on all the conductive patterns by an electrolytic plating method for which the conductive pattern on the opposite side is employed as an electrode. Further, only the first and second connecting portions 27 and 28, which have narrow line widths, pass across the dicing lines 24.

Figure 4:
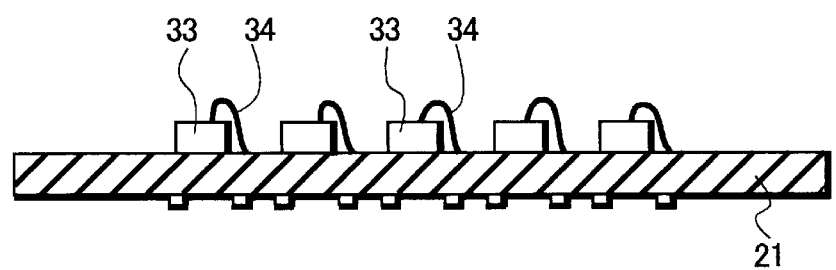
FIG. 4 is a cross-sectional view for explaining the manufacturing method of the invention.

A second step of the invention is to fix a semiconductor chip to each of the mounting portions 20 by wire bonding, as is shown in FIG. 4.

A semiconductor chip 33 is attached by die bonding and wire bonding to each mounting portion 20 of the substrate 21 on which a gold-plated layer is formed. A semiconductor 33 is fixed to the surface of an island portion 25 using an adhesive, such as a Ag paste, and the electrode pad of the semiconductor chip 33 is connected to lead portions by wires 34. As the semiconductor chips 33, active devices are formed that have three terminals, a bipolar transistor and a power MOSFET. When the bipolar devices are mounted, the external electrodes 31a and 31b, which are connected to the island portions 25, act as collector terminals, and the external electrodes 31c and 31d, which are connected to the lead portions 26 act as base-emitter electrodes.

Figure 5A:
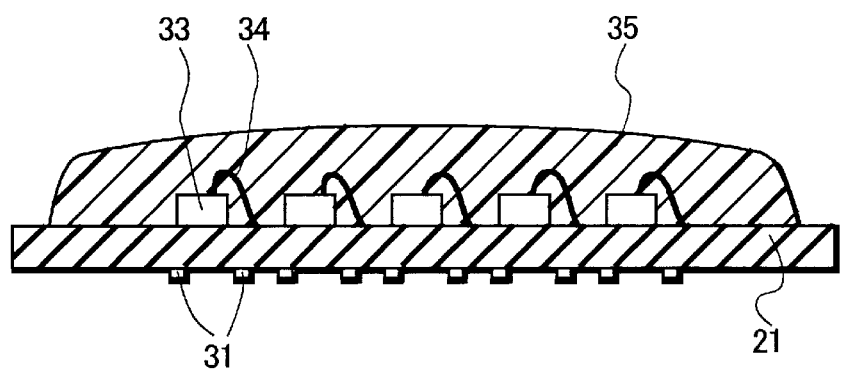
FIG. 5A is a cross-sectional view for explaining the manufacturing method of the invention and FIG. 5B is a cross-sectional view for explaining the manufacturing method of the invention.
Figure 5B:
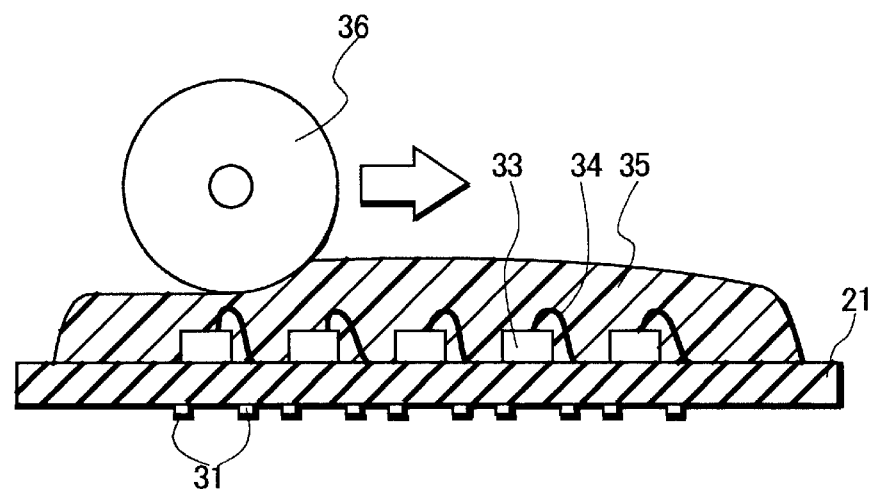

A third step of the invention is to cover the substrate 21 with a resin and to cover, with a common resin layer, the individual semiconductor chips bonded to the mounting portions, as is shown in FIGS. 5A and 5B.

As is shown in FIG. 5A, a predetermined amount of epoxy resin liquid is dropped (potting) from a dispenser (not shown) that is conveyed above the substrate 21, and all the semiconductor chips 33 are covered with a common resin layer 35. When, for example, 100 semiconductor chips 33 are mounted on one substrate 21, all 100 semiconductor chips 33 are collectively covered. For this, CV576AN (Matsushita Electric Works, Ltd.) is employed as the liquid resin. And since the dropped resin liquid is comparatively viscous and has a high surface tension, a curved resin surface is formed.

Following this, as is shown in FIG. 5B, the deposited resin layer 35 is set by employing a thermal process (curing process) for several hours at a temperature of 100 to 200° C., and the surface of the resin layer 35 is then flattened by grinding the curved surface. A dicing machine is employed for the grinding, and a dicing blade 36 is used to grind the surface of the resin layer 35 and provide a surface that is aligned, at a constant height, with the substrate 21. At this step, the height of the resin layer 35 is reduced until it has a thickness of from 0.3 to 1.0 [mm], and the resulting flat surface extends from end to end of the resin layer 35, so that even when the outermost semiconductor chips 33 are separated to obtain individual semiconductor devices, resin packages having a standard external size can be formed. For this process, dicing blades 36 of various thicknesses are prepared, and when the grinding is repeated multiple times using a comparatively thick dicing blade 36, an overall flat structure is formed.

The surface of the resin layer 35 may also be flattened by pressing a flat formation member against the surface of the deposited resin layer 35 before it has fully hardened.

Figure 6A:
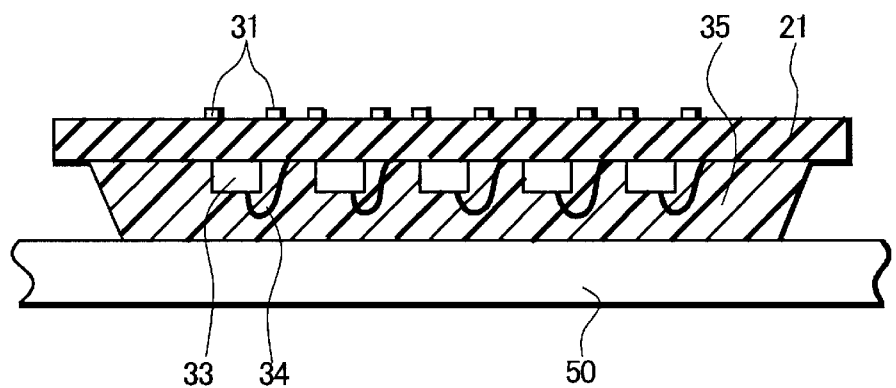
FIG. 6A is a cross-sectional view for explaining the manufacturing method of the invention and FIG. 6B is a plan view for explaining the manufacturing method of the invention.
Figure 6B:
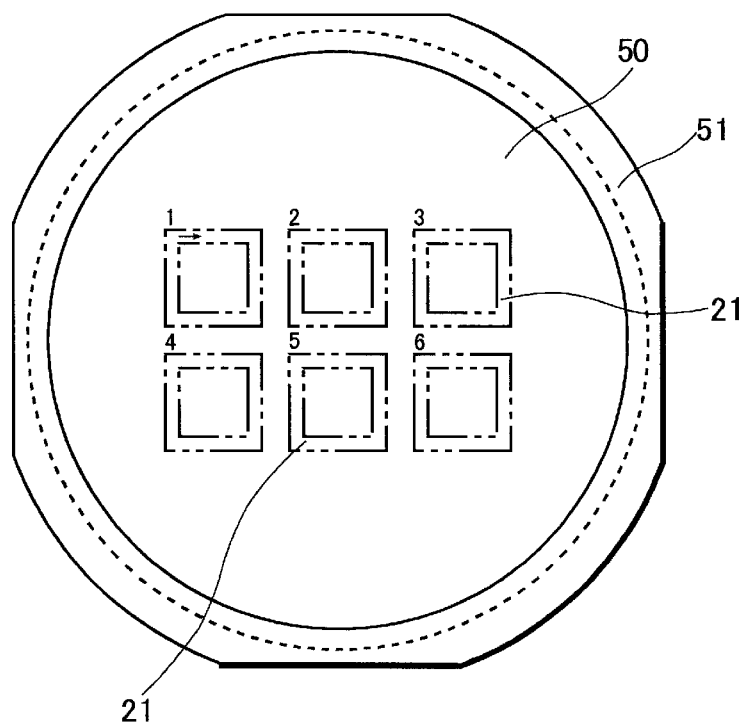

A fourth step of the invention is the gluing of a adhesive sheet 50 to the resin layer 35 covering the substrate 21, as is shown in FIGS. 6A and 6B.

As is shown in FIG. 6A, the substrate 21 is inverted, and the adhesive sheet (e.g., a UV sheet, the brand name of a Lintec Corporation product) is glued to the surface of the resin layer 35. Since as a result of the processing performed at the previous step the surface of the resin layer 35 is flat and is horizontal to the surface of the substrate 21, there is no tilting of the substrate 21, even when the adhesive sheet 50 is glued to the surface of the resin layer 35, and horizontal and vertical accuracy is maintained.

As is shown in FIG. 6B, the circumferential edge of the adhesive sheet 50 is glued to a ring-shaped stainless steel metal frame 51, and in its center, six substrates 21 are glued at regular intervals.

Figure 7A:
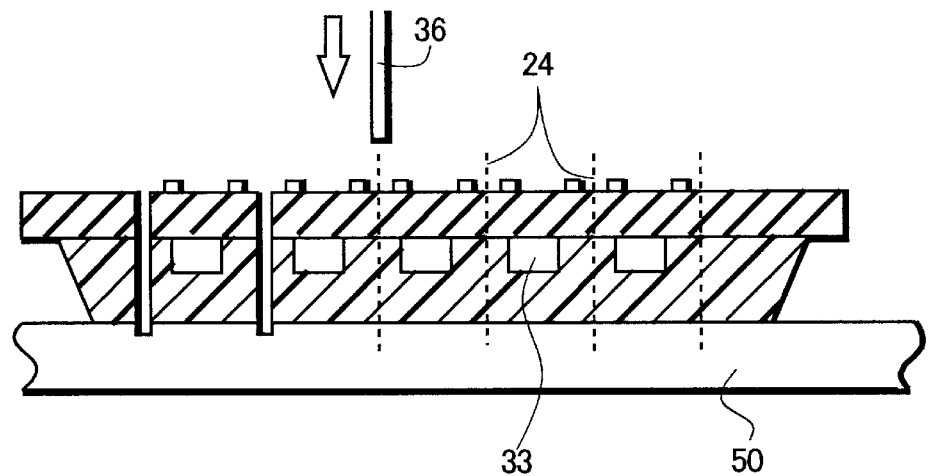
FIG. 7A is a cross-sectional view for explaining the manufacturing method of the invention and FIG. 7B is a plan view for explaining the manufacturing method of the invention.
Figure 7B:
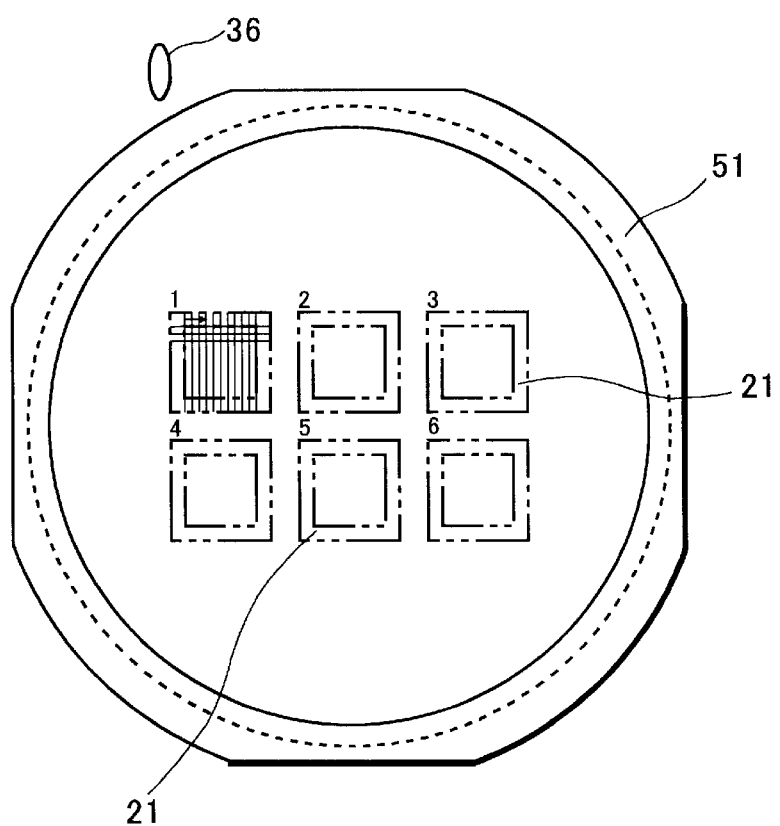

A fifth step of the invention, as is shown in FIGS. 7A and 7B, is the dicing of the substrate 21 and the resin layer 35, performed from the reverse side of the substrate 21, to cut out the mounting portions 20 and to thus obtain separate semiconductor devices.

As is shown in FIG. 7A, the substrate 21 and the resin layer 35 around each mounting portion 20 are cut, and separate semiconductor devices are obtained. The resin layer 35 and the substrate 21 are cut at the same time along the dicing lines 24 by the dicing blade 36 of the dicing machine, and separate semiconductor devices are obtained that correspond to the individual mounting portions 20. The cutting depth during the dicing process is such that the dicing blade 36 reaches and penetrates the surface of the adhesive sheet 50. At this time, an alignment mark (e.g., a through hole formed at the perimeter of the substrate 21 or in a portion of the gold-plated layer) that can be observed from the reverse side of the substrate 21 can be automatically identified by the dicing machine, and this alignment mark is used as a position reference while the dicing is being performed. Further, the pattern is so designed that the dicing blade 36 does not contact the conductive patterns 31a, 31b, 31c and 31d and the island portions 25. This is because, since the separation of the gold-plated layer is comparatively inferior, the occurrence of burrs at the gold-plated layer is prevented to the extent possible. Therefore, the dicing blade 36 contacts the gold-plated layer only at the first and the second connecting portions 27 and 28, which are used as electrical connections.

As is shown in FIG. 7B, multiple substrates 21 glued to the adhesive sheet 50, which around its circumference is glued to the metal frame 51, are separated by the dicing machine along the vertical dicing lines 24, which for each substrate 21 are individually identified. Then, the metal frame 51 is rotated 90 degrees, and the substrates 21 are separated along the horizontal dicing lines 24. The semiconductor devices obtained by the dicing continue to be supported on the adhesive sheet 50 by the adhesive agent, and are not separated individually.

Figure 8A:
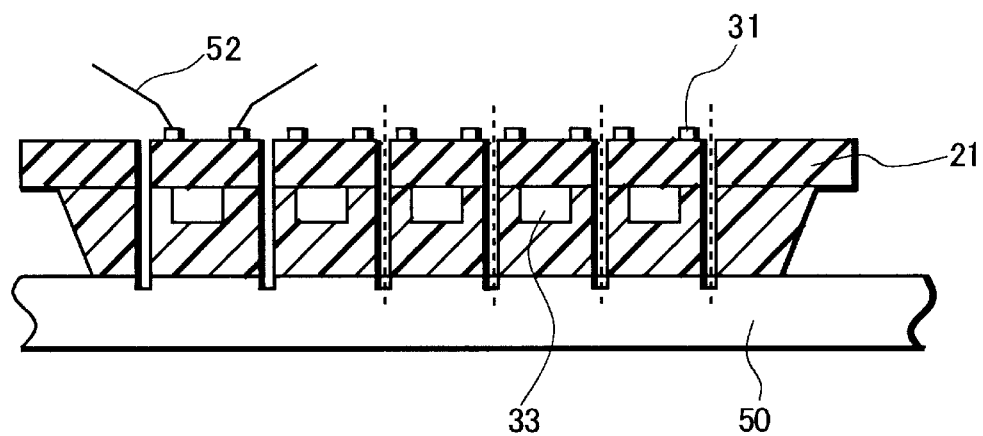
FIG. 8A is a cross-sectional view for explaining the manufacturing method of the invention and FIG. 8B is a plan view for explaining the manufacturing method of the invention.
Figure 8B:
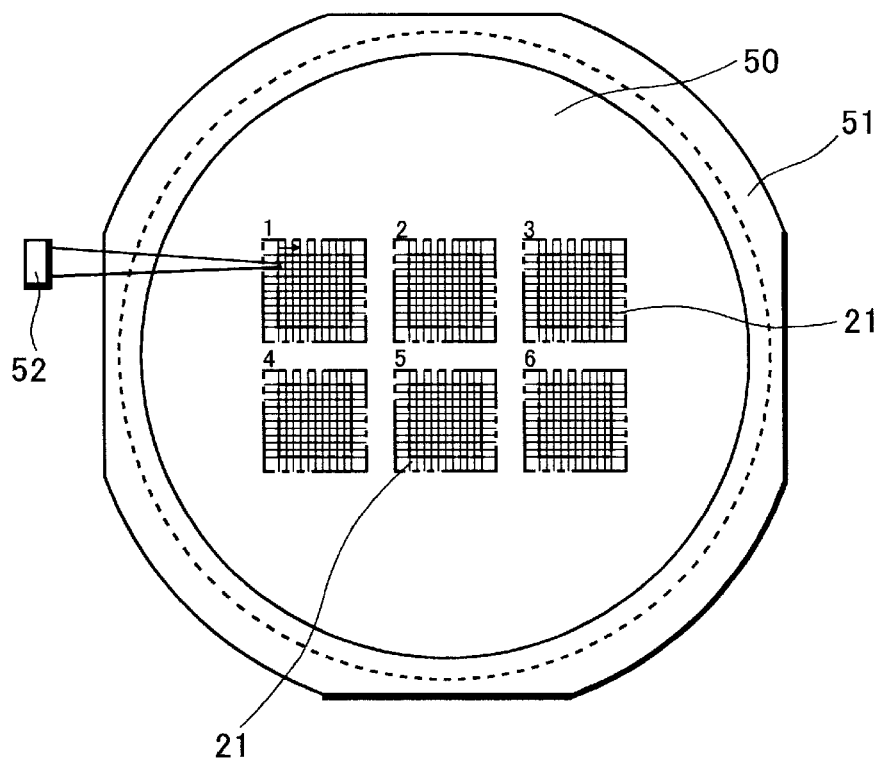

A sixth step constitutes the feature of the invention, and as is shown in FIGS. 8A and 8B, provides for the measurement of the characteristic of each of the semiconductor devices integrally supported by the adhesive sheet 50 following the dicing.

As is shown in FIG. 8A, the needles 52 of the probes contact the external electrodes 31a to 31d, which are exposed on the reverse surfaces of the substrates 21 of the semiconductor devices integrally supported by the adhesive sheet 50, and measurements of characteristic parameters are made to ascertain the quality and the characteristics (hfe ranks) of the individual semiconductor devices. Since insulating substrates made of ceramic or glass epoxy are employed as the substrates 21, the shifting of the positions of the external electrodes 31a to 31d is detected, while taking into account variances in substrate sizes due to extensions or contractions occurring during the manufacturing process and slight position shifts that occur because the substrate is supported by the adhesive sheet 50. Then, while constantly making positioning corrections in accordance with calculations performed to adjust for positioning shifts, the needles 52 of the probes are brought into contact with the external electrodes 31a to 31d and measurements are conducted.

As is shown in FIG. 8B, since multiple substrates 21 are adhered to the metal frame 51, and since the individual semiconductor devices are supported in the state existing following the dicing process, the need to determine which is the obverse and which is the reverse side of a semiconductor device, the need to determine the type of an external electrode, whether it is an emitter, a base or a collector, and the need to determine direction can be eliminated. Measurements are conducted for each substrate 21, row by row, in the direction indicated by an arrow. And when the end of a row is reached, the metal frame 51 is returned to the position it occupied before the row was processed and is shifted so that the next row can be accessed. Since the metal frame 51 is fed a set pitch in the direction of rows, while positioning corrections are made that are equivalent in size to that of a semiconductor device, and since, at the end of a row, the metal frame 51 is shifted in the direction of columns, returned to the starting position of the row, and fed a distance equivalent to a pitch in the direction of rows, measurements for a large number of semiconductor devices can be performed extremely easily. In this embodiment described above, the semiconductor device is measured in one direction with respect to the rows of each substrate 21. However, the invention is not limited to this, the measurement may be performed in the opposite direction with respect to alternate rows of each substrate.

Figure 9A:
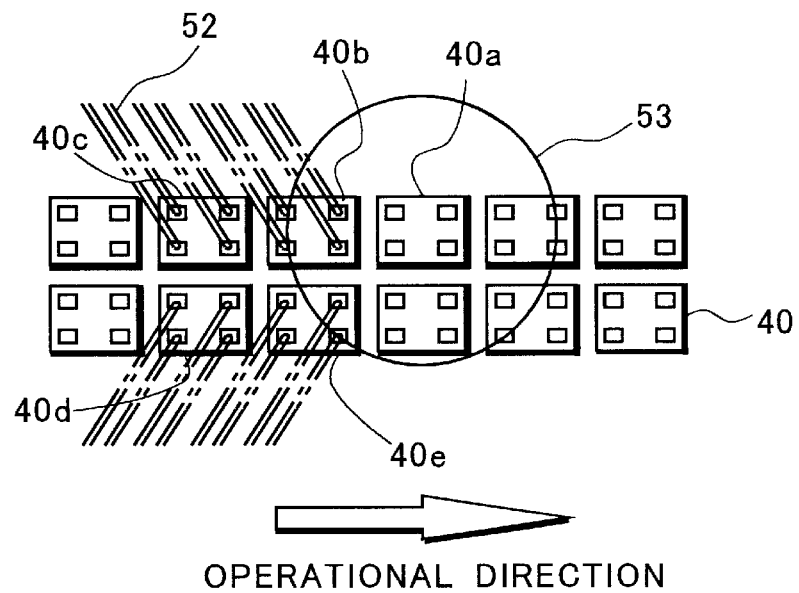
FIG. 9A is a plan view for explaining the manufacturing method of the invention and FIG. 9B is a cross-sectional view for explaining the manufacturing method of the invention.
Figure 9B:
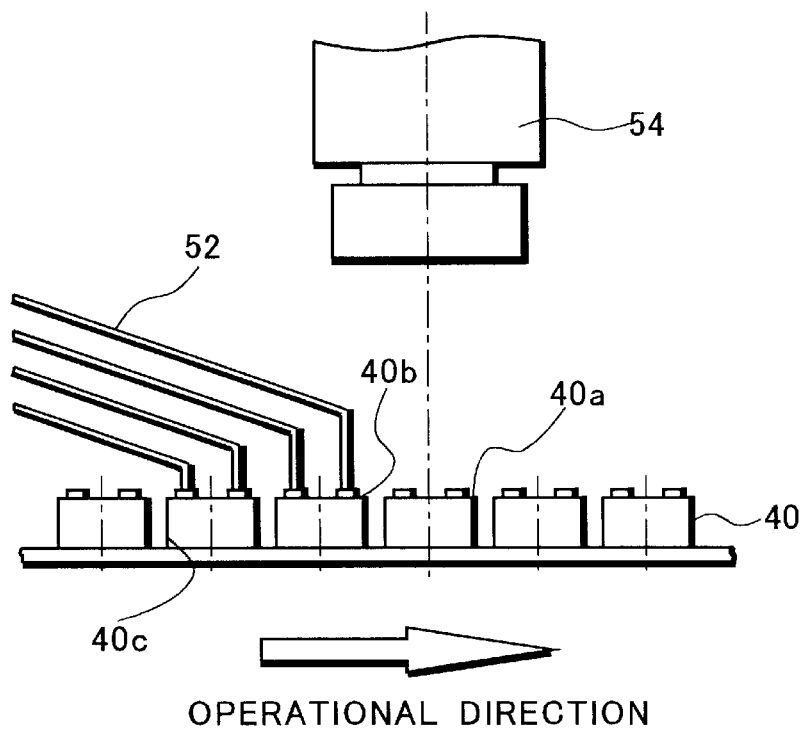

Specifically, as is shown in FIGS. 9A and 9B, the recognition camera 54 captures in the center of a field of view 53 a semiconductor device 40a, and identifies its position. At this time, not only the semiconductor device 40a but also peripheral semiconductor devices, such as 40b and 40e, are captured in the field of view 53. However, the lens of the recognition camera 54 is masked, so that only one semiconductor device is captured in the center of the field of view 53. Therefore, a semiconductor device 40a can be accurately captured in the field of view 53, and position recognition precision can be improved. Especially since small semiconductor devices 40 are collectively formed due to a slight shift in the location of an identified position, interference may occur at the time peripheral semiconductor devices are simultaneously measured, and for this reason, position recognition precision is important.

When the position of a semiconductor device 40c is identified and corrected, the needles 52 of the probes are brought into contact with the electrode pads of adjacent semiconductor devices 40b, 40c, 40d and 40e, and the characteristics of these devices are measured. At this time, for the peripheral semiconductor devices 40b, 40d and 40e positional recognition is eliminated, while it is assumed that their position shifts fall within a permissible range and only their characteristics are measured. As a result, productivity is enhanced.

During the measurement of the semiconductor devices 40b, 40c, 40d and 40e, the position of a succeeding semiconductor device 40a is identified, and a slight position shift is detected. While the position shift is corrected, the needles 52 of the probes are brought into contact with the electrode pads of this semiconductor device 40a and multiple adjacent semiconductor devices, and the characteristics of these devices are measured. After this process has been performed for one row, the next row is skipped, and the same process is performed for the following row to be measured. By repeating this process, the characteristics of all the semiconductor devices 40 on a single substrate 21 can be measured. The measurement results that are thereby obtained for the semiconductor devices 40 are stored in the memory of a tester, and are copied to a recording medium such as a floppy disk to be used for the next process.

In the process performed to measure the characteristic of the semi conductor device 40, the positions of the recognition camera 54 and the needle 52 of the probe are fixed, so that to initiate this measurement process the metal frame 51, which supports the semiconductor devices 40, is moved. During the position recognition process, the electrode pads of one semiconductor device 40 are identified, the distance that the target position is shifted is fetched by an image processing apparatus, and the next semiconductor device 40 is moved while taking into account the distance shifted.

In this embodiment, the position of one semiconductor device has been identified, while the characteristics of four adjacent semiconductor devices have been measured. However, instead of four devices, the characteristics of a maximum of ten devices can be measured without their positions being identified.

The mapping process, which is the feature of the invention, is performed at the same time as is the process for measuring and determining the characteristic (hfe rank) of a semiconductor device 40.

Figure 10:
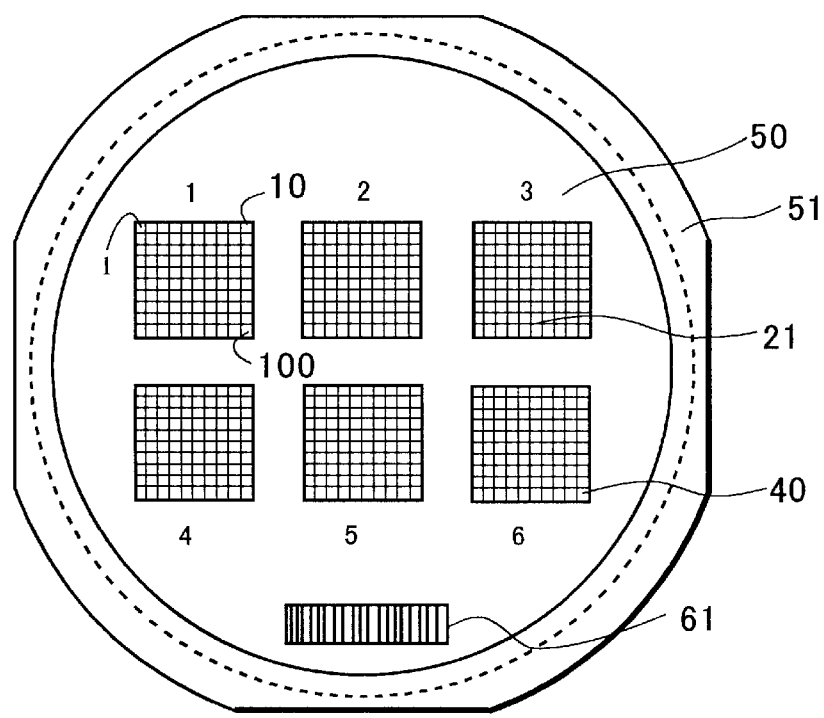
FIG. 10 is a plan view for explaining the manufacturing method of the invention.

As is shown in FIG. 10, six substrates 21 are adhered to the adhesive sheet 50 in the metal frame 51, and on each substrate 21, 100 semiconductor devices 40, for example, are arranged vertically and horizontally in ten rows and ten columns. During the mapping process, a substrate 21 on the metal frame 51 whereon the semiconductor devices 40 whose characteristics have been determined by a tester are located, the position of the semiconductor device 40 on the substrate 21 and the rank to which the characteristic (the hfe rank) of the semiconductor device 40 belong are stored as data in the memory of the tester.

In the metal frame 51, not only are six substrates 21 adhered to the adhesive sheet 50, but also a barcode 61 is affixed thereto. Multiple metal frames 51 may prepared, that by using the barcode 61 can be distinguished from each other. The numbers are provided for the substrates 21 in the metal frame 51; for example, "1" is provided for the top left substrate 21 and "6" is provided for the bottom right substrate 21. Similarly, numbers are provided for the individual semiconductor devices 40 that are formed on the substrate 21; for example, "1" is provided for the top left semiconductor device 40, and "100" is provided for the bottom right semiconductor device 40. For the characteristic (hfe rank) of a semiconductor device, for example, "1" represents an excellent semiconductor device 40 for which $70 \leq hfe < 110$ is true; "2" represents an excellent semiconductor device 40 for which $110 \leq hfe < 180$ is true; "3" represents an excellent semiconductor device 40 for which $180 \leq hfe < 240$ is true; "4" represents an excellent semiconductor device 40 for which $240 \leq hfe < 300$ is true; and "5", "6" and "7" represent defective semiconductor devices 40. In this case, since even defective semiconductor devices in multiple ranks can be determined, the cause that produces the defects can be easily pursued.

Specifically, these data are stored in a tester that uses the table shown in FIG. 11. Thereafter, these data are used when the taping process is performed.

Further, a seventh step for this invention is, as is shown in FIG. 12, the storage, directly in the carrier tape 41, of the individual semiconductor devices 40 that have been integrally supported by the adhesive sheet 50.

Figure 12A:
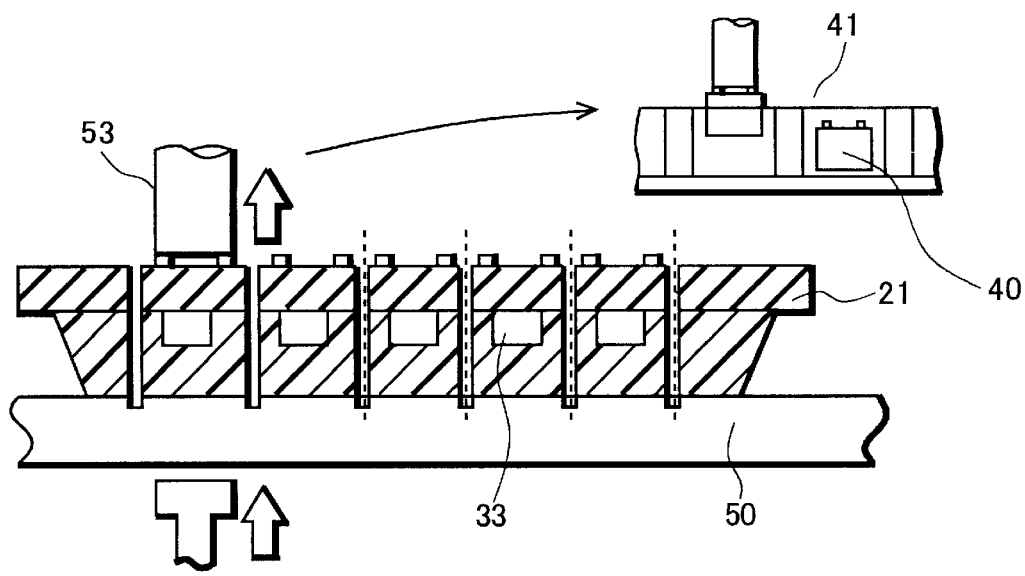
FIG. 12A is a cross-sectional view for explaining the manufacturing method of the invention and FIG. 12B is a plan view for explaining the manufacturing method of the invention.

As is shown in FIG. 12A, after the measurements performed for the semiconductor devices integrally supported by the adhesive sheet 50, only those devices for which excellent results were obtained are peeled from the adhesive sheet 50 by a vacuum collect 53, and are deposited in storage holes in the carrier tape 41.

According to the invention, during the process performed to store semiconductor devices 40 directly in the carrier tape 41, instead of all the semiconductor devices having to be sorted once in accordance with their characteristics (hfe ranks), semiconductor devices 40 having desired characteristics can be readily selected and stored. As is described above, according to the invention, by using the data in FIG. 11 the semiconductor devices 40 adhered to the adhesive sheet 50 can be stored directly in the carrier tape 41. Since only those semiconductor devices 40 having characteristics that match the needs of customers are selected and collected for storage in the carrier tape 41, the storage process can be performed along only one line for taping, without deteriorating the working efficiency. Furthermore, since the defective semiconductor devices 40 are naturally not removed from the adhesive sheet 50, these devices can be abandoned. As a result, a conventional extra operation that is required for defects can be eliminated.

Figure 12B:
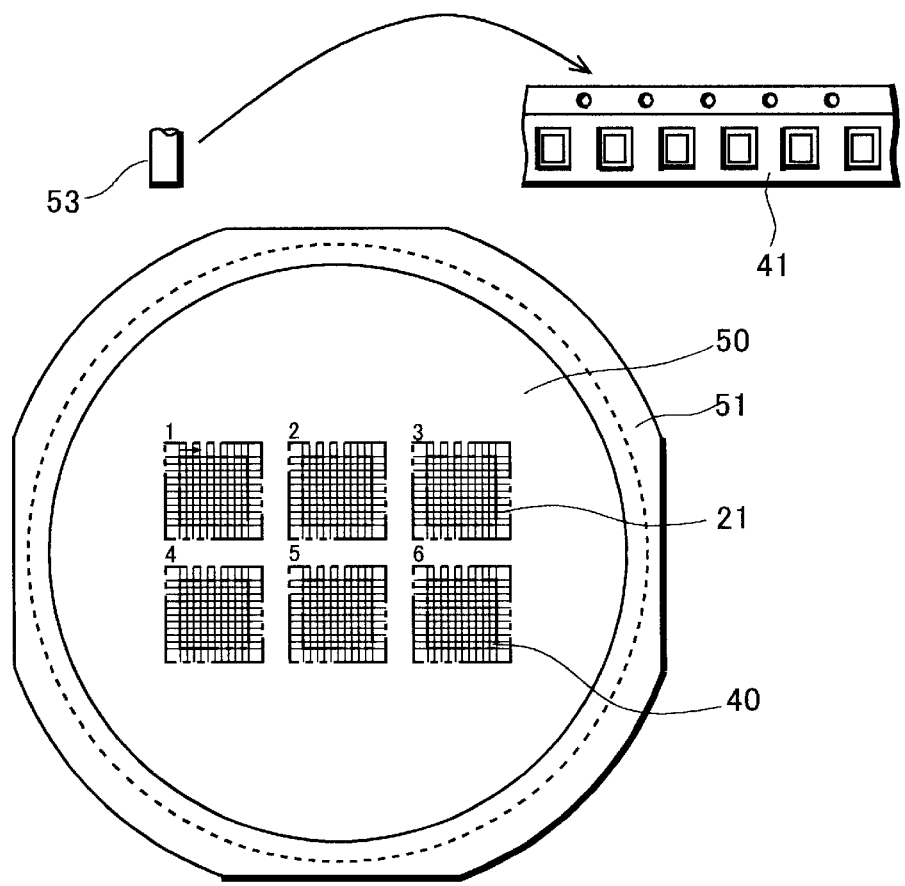

As is shown in FIG. 12B, multiple substrates 21 are glued to the metal frame 51, and the individual semiconductor devices 40 are supported in the state obtained following the dicing process. Thus, only the metal frame 51 need be moved, for the location of the required semiconductor device 40 to match that of the carrier tape 41 what is to be stored. Therefore, only minimum movement is required for the extremely easy storage of a great number of semiconductor devices 40.

Figure 13A:
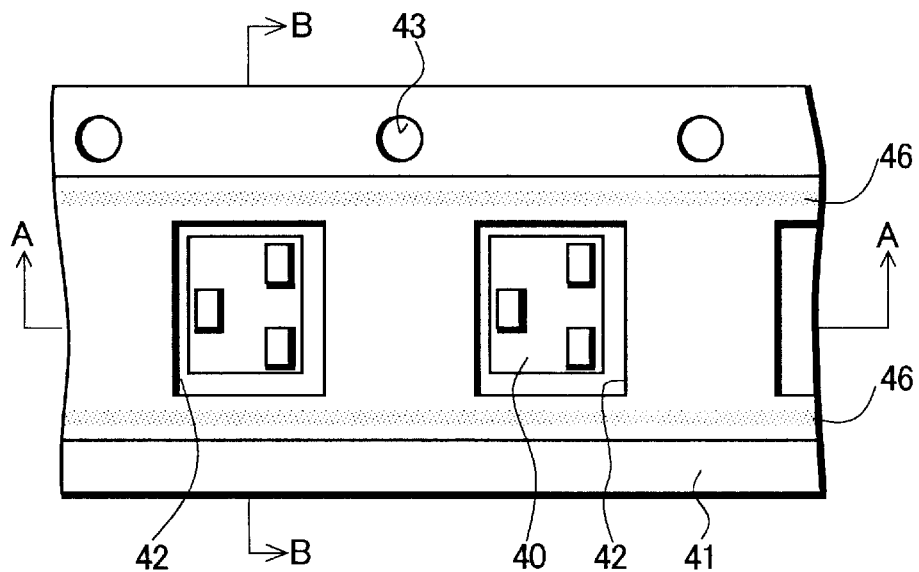
FIG. 13A is a plan view for explaining the manufacturing method of the invention.
Figure 13B:
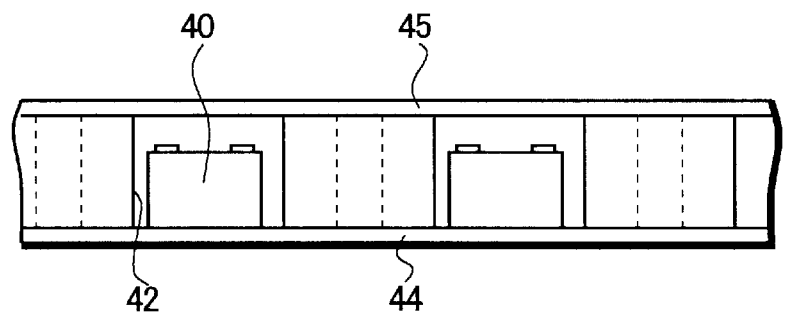
FIG. 13B is a cross-sectional view for explaining the manufacturing method of the invention.
Figure 13C:
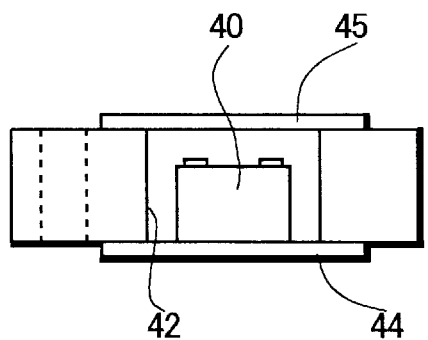
FIG. 13C is a cross-sectional view for explaining the manufacturing method of the invention.

FIG. 13A is a plan view of the carrier tape 41 used for this step, FIG. 13B is a cross-sectional view taken along line AA, and FIG. 13C is a cross-sectional view taken along line BB. The tape 41 is a belt-shaped member having a film thickness of from 0.5 to 1.0 [mm], a width of from 6 to 15 [mm] and a length of several tens of meters, and is made of paper, shaped like corrugated cardboard. Through holes 42 are formed in the tape 41 at predetermined intervals, and feed holes 43 are also formed at a predetermined pitch to feed the tape 41. A die is used to punch the through holes 42 and the feed holes 43 in the tape, and the film thickness of the tape 41 and the size of the through holes 42 are determined in accordance with the sizes of the electronic parts 40 that are to be packed.

A first tape 44 of transparent film is adhered to the reverse surface of the tape 41 to close the bottoms of the through holes 42. And similarly, a second tape 45 of transparent film is adhered to the obverse surface of the tape 41 to close the tops of the through holes 42. The second tape 45 is attached to the tape 41 at adhesive portions 46 near the side edges, while the first tape 44 is attached at corresponding locations along the reverse surface of the tape 41. This adhesive process is performed by thermally bonding the films from above using a member that has heaters positioned at locations corresponding to the adhesion potions 46. After undergoing this adhesive process, the tapes can be peeled apart simply by pulling on the films.

Figure 14A:
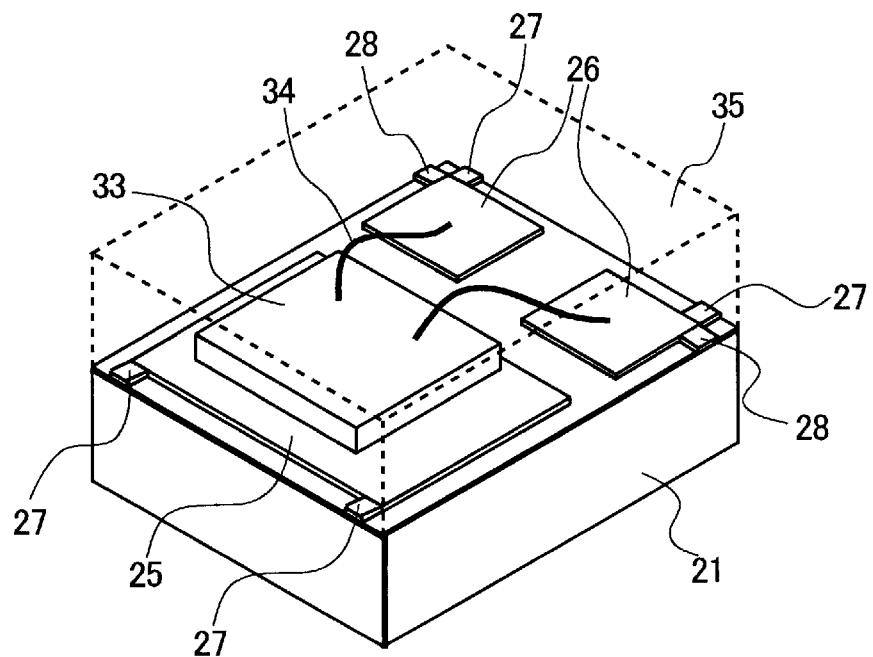
FIG. 14A is a perspective view for explaining the manufacturing method of the invention and FIG. 14B is a perspective view for explaining the manufacturing method of the invention.
Figure 14B:
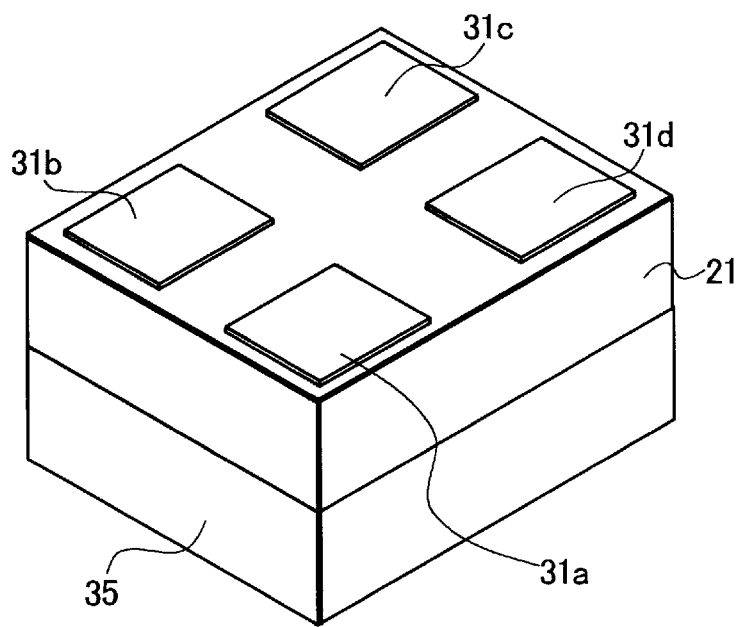
Figure 15:
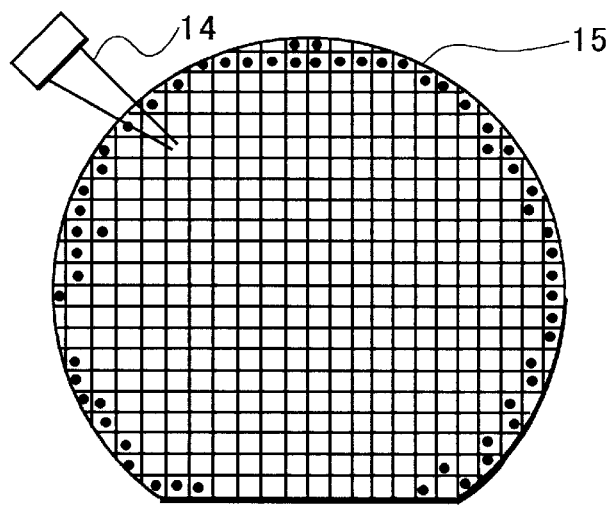
FIG. 15 is a plan view for explaining the conventional example.
Figure 16:
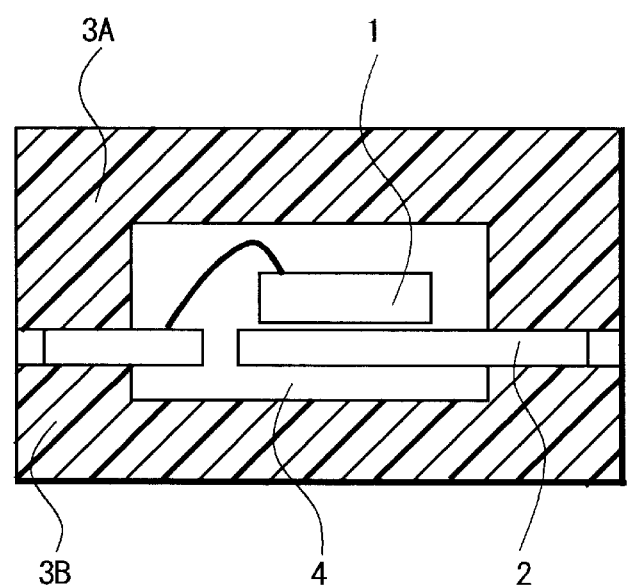
FIG. 16 is a cross-sectional view for explaining the conventional example.
Figure 17:
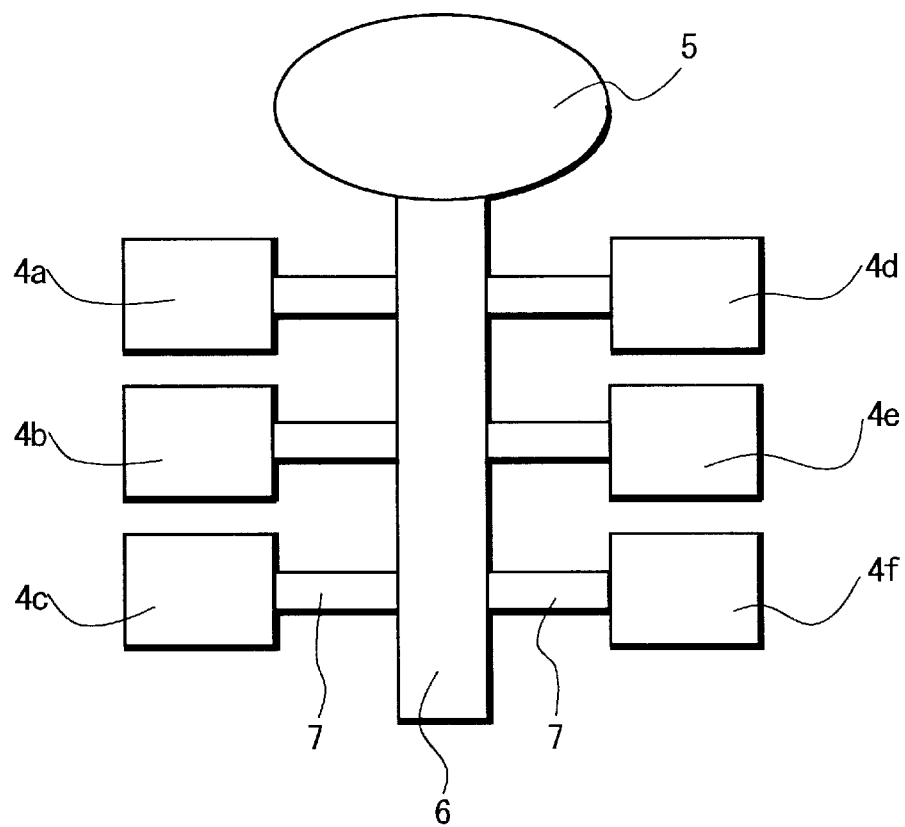
FIG. 17 is a plan view for explaining a conventional example.
Figure 18:
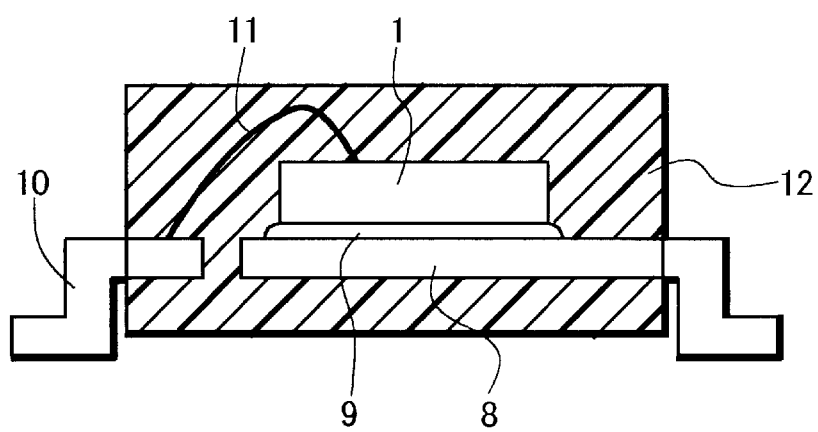
FIG. 18 is a cross-sectional view for explaining the conventional example.

Finally, FIGS. 14A and 14B are perspective views of one semiconductor device package obtained as a result of the above described processing. The four side surfaces of the package are cut surfaces formed when the resin layer 35 and the substrate 21 were cut along the dicing lines 24, the top surface of the package is the flattened surface of the resin layer 35, and the bottom of the package is the reverse surface of the insulating substrate 21.

This semiconductor device has a depth of 1.0 [mm], a width of 0.6 [mm] and a height of 0.5 [mm]. To seal the semiconductor chip 33 which has a thickness of about 150 [$\mu$m], the substrate 21 is covered with the resin layer 35 which has a thickness of about 0.5 [mm]. The island portion 25 and the lead portion 26 are retracted from the end surfaces of the package, and along the package side surfaces, only the cut portions of the first and the second connecting portions 27 and 28 are exposed.

The external electrodes 31a to 31d which are about 0.2×0.3 [mm], are arranged at the four corners of the substrate 21 in a pattern horizontally (vertically) symmetrical to the center line of the external package shape. Since this symmetrical arrangement makes the determination of the polarity of the electrode difficult, it is preferable that a polarity mark be provided by forming an indentation in the obverse surface of the resin layer, or by a printed mark.

Since with this manufacturing method semiconductor devices are produced by collectively packaging multiple devices, a reduction can be realized in the resin material that is wasted, compared with when such devices are individually packaged, and expenditures for material can be reduced. Also, since a lead frame is not required, a package can be provided that, when compared with the conventional transfer molding method, has a considerably smaller external size. And in addition, since external connection terminals are formed on the reverse surface of the substrate 21 so that they do not protrude and extend outward from the package, a considerably reduced mounting area is required for the device.

Further, according to the manufacturing method of the invention, for the dicing, the adhesive sheet 50 is glued not to the substrate 21 but to the resin layer 35. If, for example, the adhesive sheet 50 were glued to the substrate 21, when the devices were removed from the adhesive sheet 50, the viscous agent from the adhesive sheet 50 would be attached to the surfaces of the external electrodes 31a to 31d. And if the device were introduced to the automatic mounting apparatus while the viscous agent was attached, soldering of the electrodes 31a to 31d would be deteriorated. Further, a problem due to the attachment of dust to the surfaces of the electrodes 31a to 31d should also be taken into account. However, since the adhesive sheet 50 is attached to the resin layer 35 in this invention, these problems are resolved.

Since the surface of the resin layer 35 is flattened and is horizontal to the substrate 21 before the adhesive sheet 50 is adhered to the resin layer 35, the same vertical and horizontal accuracy can be maintained as is obtained when the adhesive sheet 50 is adhered to the substrate 21.

In this embodiment, four external electrodes are formed while the three-terminal devices are sealed. However, this embodiment can also be applied to a case wherein two semiconductor chips are sealed or an integrated circuit is sealed.

According to the invention, first, when the semiconductor chips are covered with the resin layer, and when multiple substrates are adhered to the adhesive sheet, the circumferential edge of which is attached to the metal frame, the processing, from the dicing to the taping, can be performed while the structure remains in that state. Therefore, regardless of how light the structure of a package is, a manufacturing method can be implemented for which the productivity is extremely high.

Second, since the data for the characteristics of the individual semiconductor devices are recorded in the tester, using this data it is possible to select only those semiconductor devices that have required characteristics, and to remove them from the adhesive sheet 50 and store them directly in the carrier tape 41. Thus, a manufacturing method can be implemented for which the productivity is extremely high and for which the taping mechanism is simplified.

Third, since the positions, the hfe ranks and the numbers of all the semiconductor devices formed on the adhesive sheet are managed as data, a manufacturing method can be provided whereby the minimum movement is required for a process whereby semiconductor devices, removed from the adhesive sheet, can be stored directly in a carrier tape.

Fourth, since the data for the positions and the characteristics of all the semiconductor devices are managed and are used for the taping process, a manufacturing method can be provided whereby the characteristics (hfe ranks) of the semiconductor devices can be sorted into multiple ranks, and whereby, along one operating line, many ranks of semiconductor devices can be stored in the carrier tape, in accordance with their characteristics, without the working efficiency being deteriorated.

Fifth, since defective semiconductor devices are not removed from the adhesive sheet, and since no sorting is required for their abandonment, a manufacturing line can be provided for which the steps and the times required for the handling of defects are reduced.

What is claimed is:

1. A method for manufacturing a semiconductor device comprising:
   providing semiconductor chips onto a substrate;
   applying a common resin layer on the semiconductor chips;
   attaching an adhesive sheet onto the resin layer;
   cutting the substrate and the resin layer while the adhesive sheet is attached to the resin layer;
   measuring the semiconductor devices;
   removing a semiconductor element from the adhesive sheet after performing the measurement of the semiconductor element; and
   directly storing the semiconductor element in a carrier tape based on the measurements.

2. A method for manufacturing a semiconductor device according to claim 1,
   wherein the semiconductor elements are stored in the carrier tape in accordance with the measurements at least along one carrier line.

3. A method for manufacturing a semiconductor device according to claim 1,
   wherein the circumferential edge of the adhesive sheet is fixed to a metal frame,
   wherein the metal frame includes a bar code,
   wherein measurement data are managed by using the bar code.

4. A method for manufacturing a semiconductor device according to claim 1,
   wherein a plurality of the substrates are adhered to the adhesive sheet, and multiple sets of measurement data for the semiconductor elements are managed.

5. A method for manufacturing a semiconductor device comprising:
   providing semiconductor chips onto a substrate;
   applying a common resin layer on the semiconductor chips;
   attaching an adhesive sheet onto the resin layer;
   cutting the substrate and the resin layer while the adhesive sheet is attached to the resin layer;
   measuring the semiconductor devices;
   removing a semiconductor element from the adhesive sheet after performing the measurement of the semiconductor element; and
   directly storing the semiconductor element in a carrier tape based on the measurements.

6. A method for manufacturing a semiconductor device according to claim 5,
   wherein the semiconductor elements are stored in the carrier tape in accordance with the measurements at least along one carrier line.

7. A method for manufacturing a semiconductor device according to claim 5,
   wherein the circumferential edge of the adhesive sheet is fixed to a metal frame,
   wherein the metal frame includes a bar code,
   wherein measurement data are managed by using the bar code.

8. A method for manufacturing a semiconductor device according to claim 5,
   wherein a plurality of the substrates are adhered to the adhesive sheet, and multiple sets of measurement data for the semiconductor elements are managed.

9. A method for manufacturing a semiconductor device comprising:
   providing semiconductor chips onto a substrate;
   applying a common resin layer on the semiconductor chips;
   attaching an adhesive sheet onto the resin layer;
   cutting the substrate and the resin layer while the adhesive sheet is attached to the resin layer;
   measuring electrical characteristics of the semiconductor devices;
   removing a semiconductor element from the adhesive sheet after performing the measurement of the semiconductor element; and
   directly storing the semiconductor element in a carrier tape based on the measurements.

10. A method for manufacturing a semiconductor device according to claim 9,
    wherein the semiconductor elements are stored in the carrier tape in accordance with the characteristics at least along one carrier line.

11. A method for manufacturing a semiconductor device according to claim 9,
    wherein the circumferential edge of the adhesive sheet is fixed to a metal frame,
    wherein the metal frame includes a bar code,
    wherein measurement data are managed by using the bar code.

12. A method for manufacturing a semiconductor device according to claim 9,
    wherein a plurality of the substrates are adhered to the adhesive sheet, and multiple sets of measurement data for the semiconductor elements are managed.

13. A method for manufacturing a semiconductor device comprising:
    fixing semiconductor chips onto a substrate;
    covering the semiconductor chips fixed onto the substrate with a common resin layer;

gluing an adhesive sheet onto the resin layer;

cutting the substrate and the resin layer in a state that the adhesive sheet is glued to the resin layer;

measuring the semiconductor devices in a state that the adhesive sheet is glued to the resin layer;

peeling a semiconductor element from the adhesive sheet after performing the measurement of the semiconductor element; and directly storing the semiconductor peeled from the adhesive sheet in a carrier tape, wherein the data for the semiconductor elements are managed when the positions and characteristics of the semiconductor elements are measured, and the semiconductor elements are stored in the carrier tape in accordance with the characteristics, wherein the circumferential edge of the adhesive sheet is fixed to a metal frame, wherein the metal frame includes a bar code, wherein the data are managed by using the bar code.

14. A method for manufacturing a semiconductor device according to claim 13, wherein the semiconductor elements are stored in the carrier tape in accordance with the characteristics at least along one carrier line.

15. A method for manufacturing a semiconductor device according to claim 13, wherein a plurality of the substrates are adhered to the adhesive sheet, and multiple sets of data for the semiconductor elements are managed.

16. A method for manufacturing a semiconductor device comprising:

fixing semiconductor chips onto a substrate;

covering the semiconductor chips fixed onto the substrate with a common resin layer;

gluing an adhesive sheet onto the resin layer;

cutting the substrate and the resin layer in a state that the adhesive sheet is glued to the resin layer;

measuring the semiconductor devices in a state that the adhesive sheet is glued to the resin layer;

peeling a semiconductor element from the adhesive sheet after performing the measurement of the semiconductor element; and directly storing the semiconductor peeled from the adhesive sheet in a carrier tape, wherein the data for the semiconductor elements are managed when the positions and characteristics of the semiconductor elements are measured, and the semiconductor elements are stored in the carrier tape in accordance with the characteristics.

wherein a plurality of the substrates are adhered to the adhesive sheet, and multiple sets of data for the semiconductor elements are managed.

17. A method for manufacturing a semiconductor device according to claim 16, wherein the semiconductor elements are stored in the carrier tape in accordance with the characteristics at least along one carrier line.

18. A method for manufacturing a semiconductor device according to claim 16, wherein the circumferential edge of the adhesive sheet is fixed to a metal frame, wherein the metal frame includes a bar code, wherein the data are managed by using the bar code.

* * * * *

UNITED STATES PATENT AND TRADEMARK OFFICE
CERTIFICATE OF CORRECTION

PATENT NO. : 6,528,330 B2  
APPLICATION NO. : 09/911972  
DATED : March 4, 2003  
INVENTOR(S) : Koji Iketani It is certified that error appears in the above-identified patent and that said Letters Patent is hereby corrected as shown below:

Col. 11, line 31, replace the text of claim 1 with the original claim 1, as follows:

1. A method for manufacturing a semiconductor device comprising steps of:
   fixing semiconductor chips onto a substrate;
   covering the semiconductor chips fixed onto the substrate with a common resin layer;
   gluing an adhesive sheet onto the resin layer;
   cutting the substrate and the resin layer in a state that the adhesive sheet is glued to the resin layer;
   measuring the semiconductor devices in a state that the adhesive sheet is glued to the resin layer;
   peeling a semiconductor element from the adhesive sheet after performing the measurement of the semiconductor element; and
   directly storing the semiconductor peeled from the adhesive sheet in a carrier tape,
   wherein, the data for the semiconductor elements are managed when the positions and characteristics of the semiconductor elements are measured, and the semiconductor elements are stored in the carrier tape in accordance with the characteristics.

Signed and Sealed this

Twenty-sixth Day of February, 2008

JON W. DUDAS  
*Director of the United States Patent and Trademark Office*